(12) United States Patent
Kerber et al.

(10) Patent No.: US 8,970,000 B2
(45) Date of Patent: Mar. 3, 2015

(54) SIGNAL TRANSMISSION ARRANGEMENT

(75) Inventors: Martin Kerber, Munich (DE);
Jens-Peer Stengl, Grafrath (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 1383 days.

(21) Appl. No.: 12/689,086

(22) Filed: Jan. 18, 2010

(65) Prior Publication Data

US 2011/0176339 A1 Jul. 21, 2011

(51) Int. Cl.
| | |
|---|---|
| *H01L 21/50* | (2006.01) |
| *H02M 3/335* | (2006.01) |
| *H01F 27/28* | (2006.01) |
| *H01L 23/48* | (2006.01) |
| *H01L 23/522* | (2006.01) |
| *H01L 23/64* | (2006.01) |
| *H01L 25/065* | (2006.01) |
| *H01L 23/00* | (2006.01) |

(52) U.S. Cl.
CPC ....... *H02M 3/33523* (2013.01); *H01F 27/2804* (2013.01); *H01L 23/48* (2013.01); *H01L 23/5227* (2013.01); *H01L 23/645* (2013.01); *H01L 25/0657* (2013.01); *H01L 2224/48463* (2013.01); *H01L 2225/0651* (2013.01); *H01L 2225/06527* (2013.01); *H01L 24/48* (2013.01); *H01L 2924/01068* (2013.01); *H01L 2924/13091* (2013.01); *H01L 2924/13055* (2013.01); *H01L 2924/30107* (2013.01)
USPC .......................................... 257/531; 257/528

(58) Field of Classification Search
USPC ............. 257/531, 528; 361/35; 336/200, 182; 438/238
See application file for complete search history.

(56) References Cited

U.S. PATENT DOCUMENTS

| | | | | |
|---|---|---|---|---|
| 6,383,916 | B1 * | 5/2002 | Lin ................................ | 438/637 |
| 6,927,662 | B2 * | 8/2005 | Kahlmann et al. ............ | 336/200 |
| 6,943,067 | B2 * | 9/2005 | Greenlaw ...................... | 438/152 |
| 7,084,728 | B2 * | 8/2006 | Hyvonen ..................... | 336/84 C |
| 7,161,248 | B2 * | 1/2007 | Karasawa et al. ............. | 257/758 |
| 7,456,722 | B1 * | 11/2008 | Eaton et al. .................... | 336/200 |
| 7,531,417 | B2 * | 5/2009 | Lin ................................ | 438/381 |
| 7,728,427 | B2 * | 6/2010 | Gabara ......................... | 257/723 |
| 7,795,735 | B2 * | 9/2010 | Hsu et al. ...................... | 257/758 |
| 7,868,462 | B2 * | 1/2011 | Choi et al. .................... | 257/777 |
| 7,932,578 | B2 * | 4/2011 | Uchida ......................... | 257/531 |
| 8,164,165 | B2 * | 4/2012 | Chang et al. .................. | 257/621 |
| 8,273,603 | B2 * | 9/2012 | Racz et al. .................... | 438/112 |
| 2006/0202269 | A1 * | 9/2006 | Suzuki et al. ................. | 257/347 |
| 2008/0050909 | A1 * | 2/2008 | Lin et al. ...................... | 438/620 |
| 2008/0203403 | A1 | 8/2008 | Kawahara et al. | |

(Continued)

FOREIGN PATENT DOCUMENTS

DE 10100282 A1 7/2002

OTHER PUBLICATIONS

Cernan, P., et al., "AC/DC Switched Mode Power Supply Control Concept Using Two Digital Signal Processors," 16th International Conference on Electrical Drives and Power Electronics, Sep. 24-26, 2007, pp. 1-5, Slovakia.

Chen, B., "Isolated Half-Bridge Gate Driver with Integrated High-Side Supply," Power Electronics Specialist Conference, 2008, pp. 3615-3618, IEEE.

(Continued)

*Primary Examiner* — Eugene Lee
(74) *Attorney, Agent, or Firm* — Slater & Matsil, L.L.P.

(57) ABSTRACT

A signal transmission arrangement is disclosed. A voltage converter includes a signal transmission arrangement.

34 Claims, 7 Drawing Sheets

(56) References Cited

U.S. PATENT DOCUMENTS

2009/0108467 A1      4/2009   Otremba
2009/0218407 A1 *   9/2009   Rofougaran .................. 235/492
2009/0243035 A1     10/2009   Mashino
2009/0280646 A1 *  11/2009   Iwaya et al. .................. 438/666

OTHER PUBLICATIONS

Chen, B., "Fully Integrated Isolated DC-DC Converter Using Micro-Transformers," Twenty-Third Annual IEEE Applied Power Electronics Conference and Exposition, 2008 pp. 335-338, IEEE.

* cited by examiner

SIGNAL TRANSMISSION ARRANGEMENT

TECHNICAL FIELD

The present disclosure relates to a signal transmission arrangement. In particular embodiments, the disclosure relates to a signal transmission arrangement for signal transmission between different voltage domains.

BACKGROUND

A voltage domain is characterized by a reference voltage to which voltage signals occurring in the voltage domain are related to. For transmitting signals between two voltage domains having different reference potentials a signal transmission arrangement is required that allows signals to be transferred between the two domains, but that prevents currents from flowing between the two voltage domains.

The two voltage domains may be implemented using integrated circuit devices. A signal transmission arrangement that is suitable for signal transmission between such voltage domains may be realized using integrated transformers that are also known as coreless transformers. A coreless transformer includes a primary and a secondary winding, where these windings are arranged distant to one another and separated by a dielectric.

SUMMARY OF THE INVENTION

A first aspect of the present disclosure relates to a signal transmission arrangement, including: a first semiconductor arrangement that includes a first semiconductor body having a first and a second side, a first dielectric layer arranged on the first side of the semiconductor body, and a primary winding of a transformer arranged in the first dielectric layer; a second semiconductor arrangement that includes a second semiconductor body having a first side and a second side, a second dielectric layer arranged on the first side of the second semiconductor body, and a secondary winding of a transformer arranged in the second dielectric layer; the first and second semiconductor arrangements being arranged such that the first and second dielectric layers face one another; at least one of the first and second semiconductor bodies having at least one contact terminal at a second side, and having a contact via extending through the at least one of the first and second semiconductor bodies.

A second aspect relates to a method of producing a semiconductor arrangement, the method including: providing a first semiconductor arrangement that includes a first semiconductor body having a first and a second side, a first dielectric layer arranged on the first side of the semiconductor body, and a primary winding of a transformer arranged in the first dielectric layer; providing a second semiconductor arrangement that includes a second semiconductor body having a first side and a second side, a second dielectric layer arranged on the first side of the second semiconductor body, and a secondary winding of a transformer arranged in the second dielectric layer; at least one of the semiconductor bodies having a contact via extending from the first side of the semiconductor body into the semiconductor body; mounting the second semiconductor arrangement to the first semiconductor arrangement such that the first and second dielectric layers face one another; after mounting the second semiconductor arrangement to the first semiconductor arrangement, exposing the at least one contact via by removing semiconductor material of the at least one semiconductor body having the contact via starting from the second side.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of the embodiments. Other embodiments and many of the intended advantages of embodiments will be readily appreciated as they become better understood by reference to the following detailed description. The drawings should help to understand the basic principle, so that only features necessary for understanding the basic principle are illustrated. The elements of the drawings are not necessarily to scale relative to each other. Like reference numerals designate corresponding similar parts.

DETAILED DESCRIPTION OF ILLUSTRATIVE EMBODIMENTS

Figure 1:
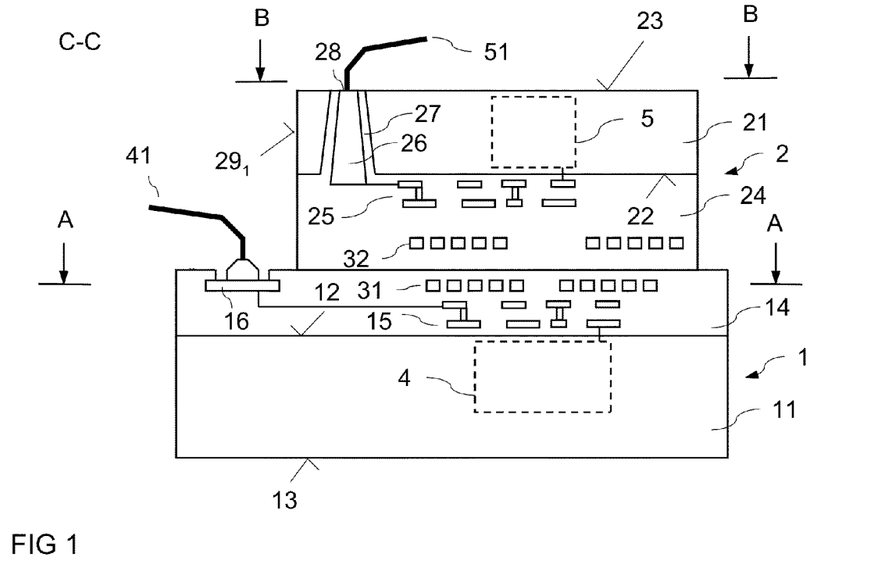
FIG. 1, by means of a cross section in a vertical section plane, illustrates a first embodiment of a signal transmission arrangement that includes two semiconductor arrangements arranged on one another.

FIG. 1 illustrates a vertical cross section through a signal transmission arrangement. The signal transmission arrangement includes two semiconductor arrangements; namely, a first semiconductor arrangement 1 and a second semiconductor arrangement 2. The first semiconductor arrangement 1 includes a semiconductor body having a first side (or surface) 12, and a second side (or surface) 13. A first dielectric layer 14 is arranged on the first side 12 of the first semiconductor body 11, and a first winding 31 of a transformer is arranged in the first dielectric layer 14. The second semiconductor arrangement 2 includes a second semiconductor body 21 having a first side (or surface) 22, and a second side (or surface) 23. A second dielectric layer 24 is arranged on the first side 22 of the second semiconductor body 21, and a second winding 32 of a transformer is arranged in the second dielectric layer 24.

The second semiconductor arrangement 2 is arranged on the first semiconductor arrangement 1 such that the first and second dielectric layers 14, 24 adjoin one another. The two windings 31, 32 are arranged distant to one another in the vertical direction, and are separated from one another in this vertical direction by sections of the first and/or second dielectric layers 14, 24, the vertical direction being the direction running perpendicular to the surfaces 12, 13 and 22, 23 of the first and second semiconductor bodies 11 and 21. The first and second windings 31, 32 are inductively coupled to one another, thereby forming a transformer. In the embodiment according to FIG. 1 this transformer is a coreless transformer, i.e., there is no transformer core arranged between the two windings 31, 32.

An inductive coupling factor is dependent on the vertical distance between the two windings 31, 32, the material of the first and second dielectric layers 14, 24, and an overlap between the two windings 31, 32 in the horizontal direction. In the embodiment according to FIG. 1 the two windings 31, 32 are planar windings, which means that each of these windings is formed by a spiral-shaped conductor that is arranged in one plane. The conductors, that form the first and second windings 31, 32 are made of an electrically conductive material, e.g., a metal, such as copper, aluminum, or titanium, or a highly doped polycrystalline semiconductor material, such as polysilicon.

The inductive coupling between the two windings 31, 32 increases with increasing overlap of the two windings 31, 32. According to a first embodiment the two windings 31, 32 have the same size in the horizontal plane and completely overlap each other. According to a second embodiment (illustrated in FIG. 1) one of the windings, e.g., the second winding 32, is larger in the horizontal plane than the other winding, e.g., the first winding 31, where the "smaller" winding is completely overlapped by the "larger" winding. Implementing one of the windings with larger dimensions, i.e., a larger diameter then the other winding, reduces the influence of production tolerances, in positioning the second semiconductor arrangement 2 on the first semiconductor arrangement 1, on the inductive coupling factor. Thus, even if there are positioning tolerances a complete overlap of the smaller winding by the larger winding can still be achieved.

The first and second windings 31, 32 arranged in the first and second dielectric layers 14, 24 may be implemented using commonly known method steps for realizing conductors in dielectric layers. These method steps may correspond to commonly known method steps for producing a wiring in a dielectric layer above a semiconductor body. The dielectric layers 14, 24 are, e.g., made of an oxide, an imide, or an epoxy material. According to one embodiment each of these layers is uniformly made of one dielectric material. According to a second embodiment at least one of the dielectric layers is a layer stack that includes a plurality of dielectric layers made of different dielectric materials.

The first semiconductor arrangement 1 further includes a first wiring arrangement 15 arranged in the first dielectric layer 14, and the second semiconductor arrangement 2 further includes a second wiring arrangement 25 arranged in the second dielectric layer 24. These wiring arrangements 15, 25 are only schematically illustrated in FIG. 1. Each of these wiring arrangements 15, 25 includes at least one wiring layer. According to an embodiment the wiring arrangements 15, 25 include a plurality of wiring layers, where conductors or wirings in the individual wiring layers may be interconnected with each other by vias. Such wiring arrangements are commonly known so that no further explanations are required in this regard.

The first winding 31 is electrically connected to the first wiring arrangement 15, and the second winding 32 is electrically connected to the second wiring arrangement 25. Connections between the windings 31, 32 and the wiring arrangements 15, 25 are only schematically illustrated in FIG. 1. Each of the wiring arrangements 15, 25 may include a plurality of conductors that are electrically insulated from one another, each of these conductors serving to interconnect circuit nodes or electrical components arranged in the individual semiconductor arrangements 1, 2. Each of the semiconductor arrangements 1, 2 has at least one external terminal 41, 51 that is electrically connected via contact electrodes 16, 28 to the wiring arrangements 15, 25 of the individual semiconductor arrangements 1, 2. Electrical connections between the contact electrodes 16, 28 and the wiring arrangements 15, 25 are only schematically illustrated in FIG. 1. Terminals 41, 51 serve to externally contact circuit components arranged in the first and second semiconductor arrangements 1, 2. According to a first embodiment the first wiring arrangement 15 connects the first winding 31 to the at least one external terminal 41 of the first semiconductor arrangement 1, and second wiring arrangement 25 connects the second winding 32 to the external terminal 51 of the second semiconductor arrangement 2.

According to a further embodiment, a first integrated circuit 4 (illustrated in dashed lines) is integrated in the first semiconductor body 11, and a second integrated circuit 5 (illustrated in dashed lines) is integrated in the second semiconductor body 21. In this embodiment the first wiring arrangement 15 connects the first winding 31 to the first integrated circuit 4, and connects the integrated circuit 4 to the at least one external terminal 41 of the first semiconductor arrangement 1. Further, the second wiring arrangement 25 connects the second winding 32 to the second integrated circuit 5 and connects the second integrated circuit 5 to the at least one external terminal 51 of the second semiconductor arrangement 2.

Figure 2:
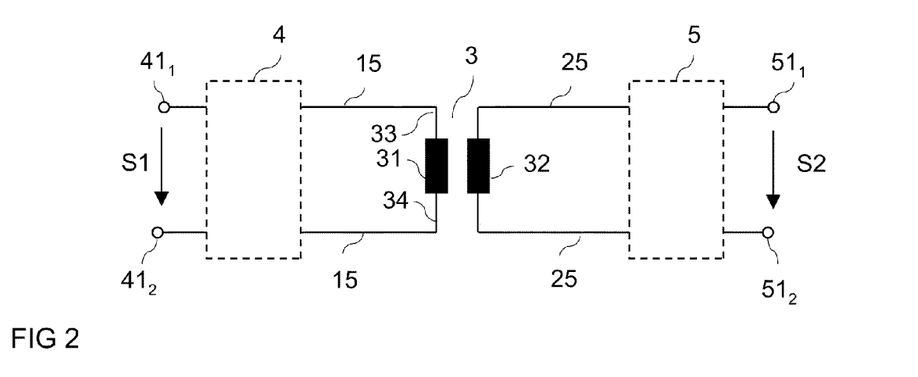
FIG. 2 shows the equivalent circuit diagram of one embodiment of the signal transmission arrangement according to FIG. 1.

FIG. 2 illustrates the equivalent circuit diagram of the signal transmission arrangement explained so far with reference to FIG. 1. Referring to FIG. 2 the two windings 31, 32 form a transformer 3. In the embodiment illustrated each of the windings 31, 32 is coupled to two external terminals: the first winding 31 is coupled to a first and a second external terminal $41_1$, $41_2$; and the second winding 32 is coupled to a third and a fourth external terminal $51_1$, $51_2$. In FIG. 1 external terminal 41 represents one of the external terminals $41_1$, $41_2$, and external terminal 51 represents one of the external terminals $51_1$, $51_2$.

According to a first embodiment the first and second windings 31, 32 are directly connected with their external terminals $41_1$, $41_2$, $51_1$, $51_2$. In this connection "directly connected" means that there are no additional components between the external terminals and the windings 31, 32, or that there are only passive components, such as resistances, capacitances, inductances, between the external terminals and the windings 31, 32 but no active components. In the first embodiment the first wiring arrangement 15 only includes two connection lines: a first connection line for connecting a first terminal of the first winding 31 to the first external terminal $41_1$; and a second connection line for connecting a second terminal of the first winding 31 to the second external terminal $41_2$. Equivalently the second wiring arrangement 25 only includes two connection lines: a first connection line for connecting a first terminal of the second winding 32 to the third external terminal $51_1$; and a second connection line for connecting a second terminal of the second winding 32 to the fourth external terminal $51_2$.

According to a second embodiment the first winding 31 is coupled to the external terminals $41_1$, $41_2$ via the first integrated circuit 4 (shown in dashed lines), and the second winding 32 is coupled to the third and fourth external terminal $51_1$, $51_2$ via the second integrated circuit 5. In this case the first and second wiring arrangements 15, 25 include the connection lines between the windings 31, 32 and the integrated circuits 4, 5, the connection lines between the integrated circuits 4, 5 and the external terminals $41_1$, $41_2$, $51_1$, $51_2$. Further, in this case the first wiring arrangement 15 may include connection lines for interconnecting circuit components (not shown) of the first integrated circuit 4, and the second wiring arrangement 25 may include connection lines for interconnecting circuit components (not shown) of the second integrated circuit 5.

The arrangement is suitable for transmitting a voltage or a current signal from a first pair of the external terminals via the transformer 3 to a second pair of the external terminals. For explanation purposes it is assumed that the first winding 31 is the primary winding of the transformer, and that the second winding 32 is the secondary winding of the transformer. In this case an input signal S1 is applied between the first and second external terminals $41_1$, $41_2$ is transmitted via the transformer 3, and results in an output signal S2 between the third and fourth external terminals $51_1$, $51_2$. In the first embodiment explained before, in which the windings 31, 32 are directly connected to the external terminals, the input signal S1 needs to be a signal suitable to be transmitted via the transformer 3. This can either be a pulse modulated signal or a signal with suitable frequency or which is frequency modulated. Accordingly, the output signal S2 is a signal with a similar characteristic. In the second embodiment, in which the windings 31, 32 are connected to the external terminals via integrated circuits, the first integrated circuit 4 may be a transmitter circuit, and the second integrated circuit 5 may be a receiver circuit. The transmitter circuit 4 is adapted to transform the input signal S1 into a signal suitable to be transmitted via the transformer 3. Thus, transmitter circuit 4 may include a modulation, and, optionally, an encoding unit, and receiver circuit 5 may include a demodulation and, optionally, a decoding unit.

Referring to FIG. 1 the external terminals 41, 51, or the contact electrodes 16, 28 respectively, are arranged on different vertical levels of the signal transmission arrangement. The at least one contact electrode 16 of the first semiconductor arrangement 1 is arranged in or on the first dielectric layer 14 in a section of the first dielectric layer 14 that is not covered by the second semiconductor arrangement 2. This is possible due to the fact that horizontal dimensions of the second semiconductor arrangement 2 are smaller than horizontal dimensions of the first semiconductor arrangement 1. The second contact electrode 28 is arranged in or on the second surface 23 of the second semiconductor arrangement 2, the second surface 23 being the surface facing away from the interface between the first and second dielectric layers 14, 24. The second contact electrode 28 is electrically connected to the second wiring arrangement 25 by a contact via 26 extending through the second semiconductor body 21 in a vertical direction. Contact via 26 is dielectrically insulated from the second semiconductor body 21 by a dielectric layer 27.

In the arrangement according to FIG. 1 a distance between the two contact electrodes 16, 28 at least corresponds to the height of the second semiconductor arrangement 2, the height of the second semiconductor arrangement 2 corresponding to the sum of the vertical thickness of the first semiconductor body 21, and the vertical thickness of the second dielectric layer 24. The distance between the contact electrodes 16, 28 and between the external terminals 41, 51, respectively, is important in those cases in which the input and the output signal (S1, S2 in FIG. 2) are signals of different voltage domains, i.e., signals that are related to different reference potentials. In these cases the transformer 3 has to be adapted to withstand a voltage corresponding to a difference between the two reference potentials. Since this voltage difference is also present between the external terminals 41, 51, a creepage distance between these terminals should be long enough in order to prevent a voltage breakthrough along the surface between the external terminals.

Figure 3:
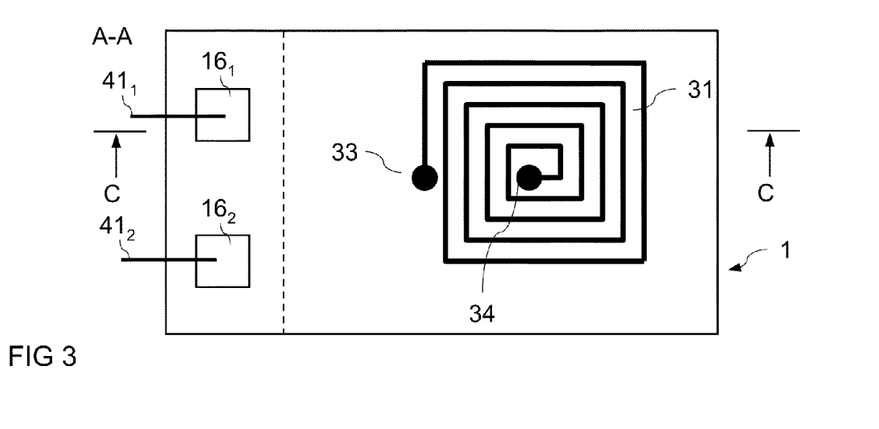
FIG. 3 illustrates a cross section in a horizontal section plane through the first semiconductor arrangement.

FIG. 3 illustrates a cross section through the arrangement illustrated in FIG. 1 in a horizontal section plane A-A that, in the present example, cuts through the first winding 31. In the example illustrated first winding 31 is a spiral winding having a rectangular, in particular, square, geometry in the horizontal plane. However, this is only an example, it goes without saying that any other geometry of the winding, such as an elliptical, in particular, circular, geometry, may be used as well. In the embodiment according to FIG. 3 the first semiconductor arrangement 1 has two external terminals $41_1$, $41_2$ and two contact terminals $16_1$, $16_2$, respectively. These terminals are arranged distant to one another in a horizontal direction. In the embodiment according to FIGS. 1 and 3 the direction in which the contact electrodes $16_1$, $16_2$ are distant to one another is perpendicular to the vertical section plane C-C illustrated in FIG. 3. In FIG. 3, reference characters 33, 34 denote terminals of the first winding 31. In a manner not illustrated in detail these terminals 33, 34 are connected to the first wiring arrangement 15, the first wiring arrangement 15 being arranged in a horizontal plane (or in horizontal planes) that is different from the horizontal section plane A-A illustrated in FIG. 3.

Figure 4:
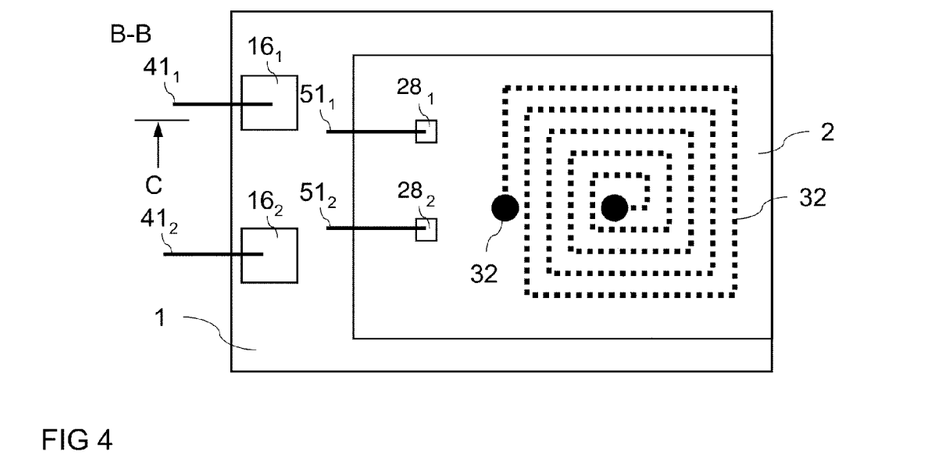
FIG. 4 illustrates a top view of the semiconductor arrangement according to FIG. 1.

FIG. 4 illustrates a top view on the semiconductor arrangement of FIG. 1, where for a better understanding the position of the second winding 32 within the second semiconductor arrangement 2 is illustrated as well (in dashed lines). Like the first winding 31 illustrated in FIG. 3 second winding 32 may also have a rectangular geometry. However, it goes without saying, that any other geometries, such as elliptical, in particular, circular, geometries may be used as well.

In the embodiment according to FIG. 1 contact electrode 28 of the second semiconductor arrangement 2 is arranged close to a first edge $29_1$ of the second semiconductor body 21 respectively. The first edge $29_1$ is the edge of the second semiconductor arrangement 2 that is the edge closest to the contact electrode 16 of the first semiconductor arrangement 1.

Figure 5:
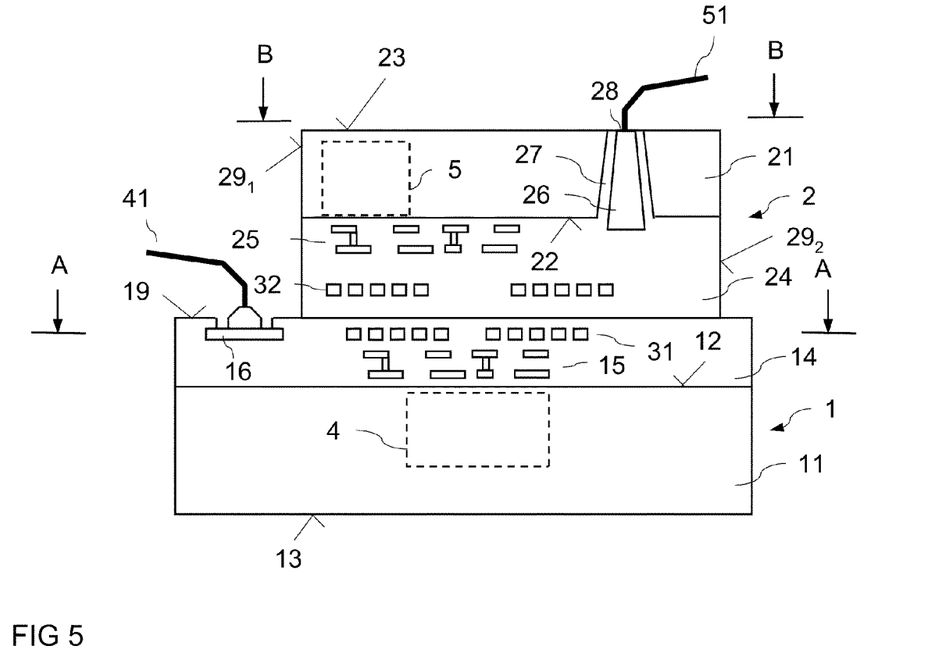
FIG. 5 illustrates by means of a cross section a second embodiment of a signal transmission arrangement including two semiconductor arrangements.

FIG. 5 illustrates a modification of the embodiment according to FIG. 1. In the embodiment according to FIG. 5 the creepage distance between the external terminals 51 of the first semiconductor arrangement 1 and 51 of the second semiconductor arrangement 2 is increased due to the fact that the contact electrode 28 of the second semiconductor arrangement 2 is arranged near a second edge $29_2$ of the second semiconductor arrangement 2. The second edge $29_2$ is the edge opposite to the first edge $29_1$, the second edge $29_2$ therefore being the edge of the second semiconductor arrangement 2 that is arranged most distant to the contact electrode 16 of the first semiconductor arrangement 1. In the embodiment according to FIG. 5 in a horizontal direction the second winding 32 and/or the second wiring arrangement 25 are at least partly arranged between the electrodes 16, 28.

Figure 6:
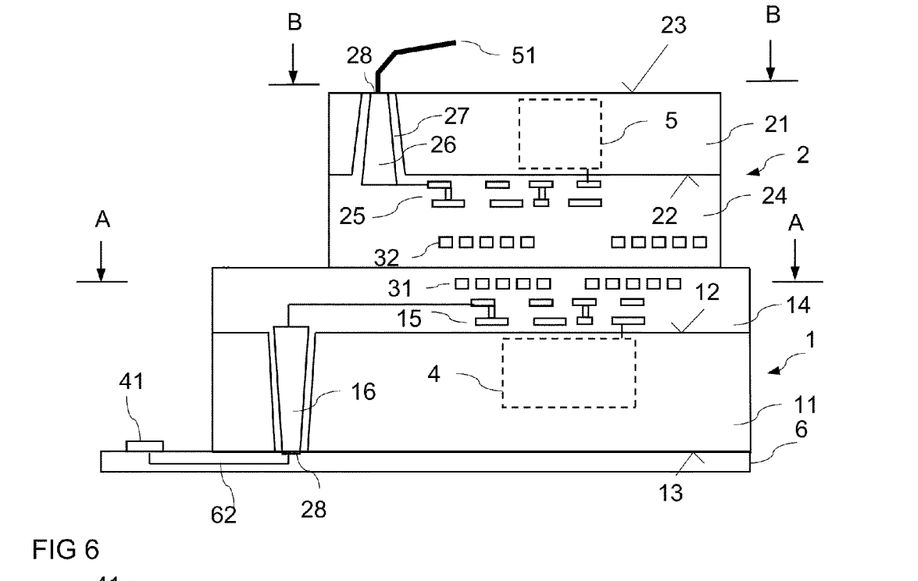
FIG. 6 illustrates, by means of a cross section, a second embodiment of a signal transmission arrangement including two semiconductor arrangements.

FIG. 6 illustrates a further modification of the embodiment according to FIG. 1. In the embodiment according to FIG. 6 both, the first semiconductor body 11, and the second semiconductor body 21 have a contact via 26 that extends through the semiconductor body 11, 21 to the surface 13, 23 that faces away from the interface between the two dielectric layers 14, 24. The contact via 26 of the second semiconductor arrangement 2 is connected to the first wiring arrangement 15, which is only schematically illustrated in FIG. 6. The second side of the first semiconductor body 11 is mounted on a carrier 6, the carrier having a conductor 62 (which is only schematically illustrated) that contacts the contact via 26, and that in a lateral direction of the carrier extends to a contact pad 61. Contact pad 61 is arranged in a section of the carrier 6 the protrudes beyond the first semiconductor arrangement 1 and that serves as the external terminal 41 of the first semiconductor arrangement 1. In the embodiment according to FIG. 6 the creepage distance between the external terminals 41, 51 is increased compared to the embodiment in FIG. 1. Contact pad 41 may also be part of a metal redistribution layer that is included in a package (not shown) that houses the first semiconductor body 11.

According to one embodiment at least one of the first and second windings 31, 32 is arranged in a package (not shown) housing the first or second semiconductor body 11, 21. In this case, the dielectric layer is a material that is suitable to act as a housing, such as, e.g. an epoxy material. According to another embodiment, each of the windings 31, 32 is arranged in a packages that surrounds the first and the second semiconductor body 11, 21, respectively. In this case, both semiconductor arrangements include a semiconductor body 11, 21, and a package that includes the semiconductor body 11, 21, where the dielectric layers 14, 24 are part of the housing. For forming the transmission arrangement only the packages of the two semiconductor arrangements 1, 2 need to be mounted on one another, where an additional dielectric layer can be arranged between the packages.

A method for producing the signal transmission arrangements explained before will now be explained with reference to FIGS. 7A to 7D. The following explanation relates to a method for producing the arrangement according to FIG. 5. However, this method can easily be adapted to produce any of the signal transmission arrangements explained before.

Figure 7A:
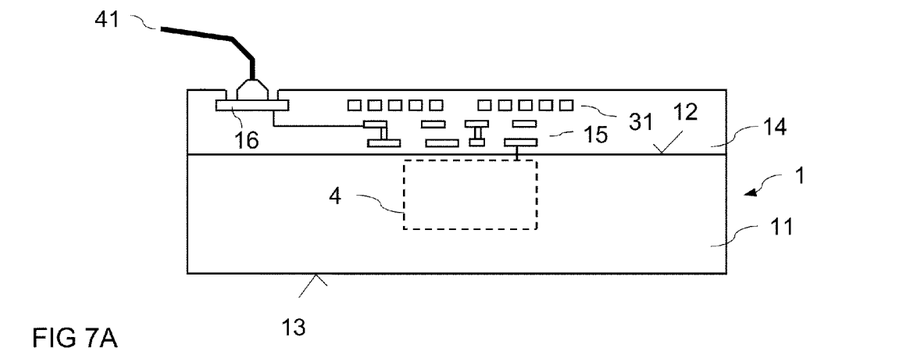
FIGS. 7A-7D illustrate method steps of a first embodiment of a method for producing a signal transmission arrangement.

Referring to FIG. 7A the method includes providing the first semiconductor arrangement 1 having the first semiconductor body 11, a first dielectric layer 14 arranged on the first side 12 of the first semiconductor body 11, a first wiring arrangement 15 arranged in the first dielectric layer 14, and a first winding 31 arranged in the first dielectric layer 14. Optionally a first integrated circuit 4, such as a transmitter circuit, is integrated in the first semiconductor body 11. The first semiconductor arrangement 1 further includes a contact electrode 16 that is electrically connected to the first wiring arrangement 15. Further, the first winding 31 and the optional first integrated circuit 4 are connected to the first wiring arrangement 15.

The first semiconductor arrangement 1 can be produced using conventional method steps. These method steps may involve providing the semiconductor body 11, and integrating the optional first integrated circuit 4 in the semiconductor body 11. In this connection it should be mentioned that semiconductor body 11 may either be comprised of a semiconductor substrate, or of a semiconductor substrate and an epitaxial layer arranged on the substrate, with the optional integrated circuit 4 being integrated in the epitaxial layer. After integrating integrated circuit 4 in the semiconductor body 11 the wiring arrangement 15 is produced. Wiring arrangement 15 may include several wiring layers, such as metallization layers, where conductors are formed in each wiring layer, and where conductors in individual layers may be interconnected by vias. Methods for forming wiring arrangements are commonly known, so that no additional explanations are required in this regard.

After forming the first wiring arrangement 15 the first winding 31 is formed. The method steps for forming the first winding 31 may correspond to method steps employed in forming one wiring layer of the first wiring arrangement 15. These method steps may include depositing a dielectric layer, etching a spiral-shaped trench in the dielectric layer, and filling the trench with an electrically conducting material, thereby forming the first winding 31. The contact electrode 16 may be formed by the same method steps employed for forming first winding 31. Finally a dielectric layer may be formed that covers the first winding 31. In this connection it should be mentioned that the first dielectric layer 14 according to FIG. 7A may be comprised of a number of dielectric layers that are subsequently deposited.

Figure 7B:
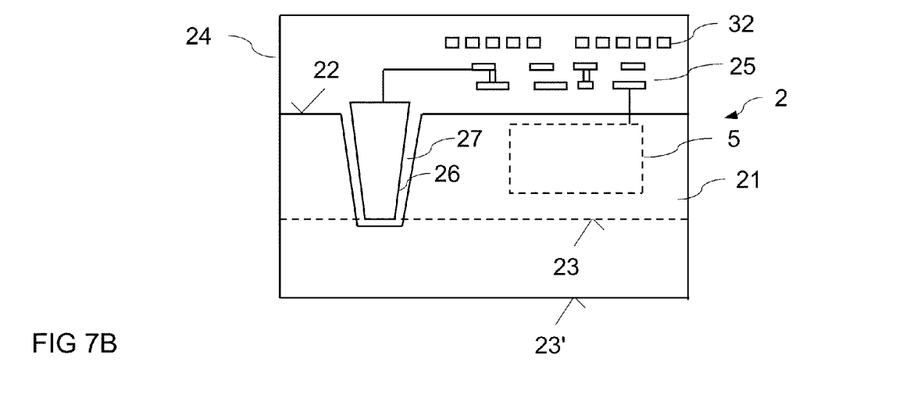

Referring to FIG. 7B the production method further involves providing the second semiconductor arrangement 2. The second semiconductor arrangement 2 includes the second semiconductor body 21, the second dielectric layer 24 arranged on the first side 22 of the first semiconductor body 21, the second wiring arrangement 25 and the second winding 32 both arranged in the second dielectric layer 24. The second semiconductor arrangement 2 further includes a contact plug 26 that starting from the first side 22 of the second semiconductor body 21 extends into the semiconductor body 21, but, at this stage of the production process, does not yet extend to a second surface 23' of the second semiconductor body 21. Contact plug 26 is electrically insulated from the semiconductor body 21 by dielectric layer 27. Except for additional method steps that are required for producing the contact plug 26 the method steps for producing the second semiconductor arrangement 2 may correspond to the method steps of forming the first semiconductor arrangement 1. Method steps for producing the contact plug 26 will be explained with reference to FIGS. 8A to 8F in the following.

Optionally the second integrated circuit 5, such as a receiver circuit may be integrated in the second semiconductor body 21. In this connection it should be mentioned that the integration of integrated circuits in the first and second semiconductor bodies 11, 21 is only optional. In embodiments in which no integrated circuits are integrated in the semiconductor body, the semiconductor bodies merely serve as carriers for the dielectric layers 14, 24 in which the winding 31, 32 are integrated. It goes without saying, that it is also possible to integrate an integrated circuit only in one of the two semiconductor bodies.

Figure 7C:
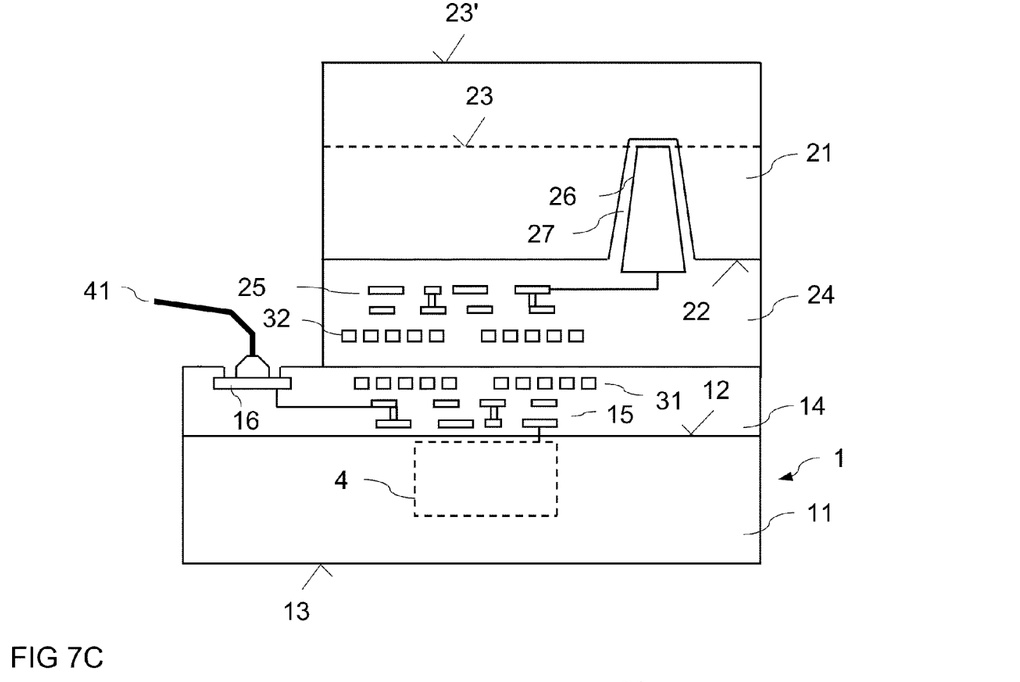

Referring to FIG. 7C the second semiconductor arrangement 2 is mounted on the first semiconductor arrangement 1 such that the first and second dielectric layers 14, 24 face each other. The first and second semiconductor arrangements 1, 2 are, e.g., joined using a glue. Conventional methods known from the so-called flip-chip technology may be applied in connection with gluing the second semiconductor arrangement 2 onto the first semiconductor arrangement 1. The glue is selected to have dielectric properties that are adapted to the dielectric properties, such as the dielectric strength, of the first and second dielectric layers 14, 24. Prior to joining the two semiconductor arrangements at least one of the first and second dielectric layers is planarized. Planarization may involve, e.g., a chemical mechanical polishing (CMP) process.

It should be mentioned, that providing the first semiconductor arrangement 1 may include providing a semiconductor wafer (not shown) that includes a number of identical first semiconductor arrangements, and separating the wafer into the individual first semiconductor arrangements 1. Equivalently, providing the second semiconductor arrangement 2 may include providing a semiconductor wafer (not shown) that includes a number of identical second semiconductor arrangements, and separating the wafer into the individual second semiconductor arrangements 2. All the process steps performed prior to joining the two semiconductor arrangements 1, 2, such as the CMP process, e.g., may be performed on the wafer.

Figure 7D:
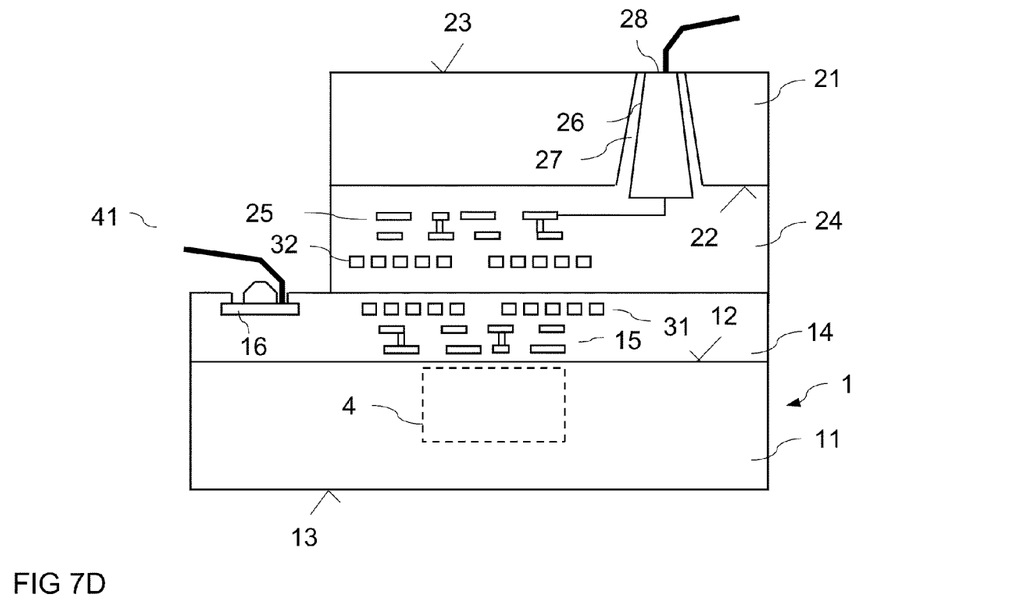

Referring to FIG. 7D contact plug 26 is uncovered by removing semiconductor material of the second semiconductor body 21 starting from the second side 23. The section 28 of the contact plug 26 that is uncovered after removing parts of the semiconductor body 21 forms the contact electrode 28. Optionally, an additional electrode (not shown) may be arranged on this contact surface 28.

In the complete arrangement (see FIG. 7D) a vertical distance between the first and second windings 31, 32 can be adjusted by suitably selecting layer thicknesses of the dielectric layers covering the windings 31, 32 in the first semiconductor arrangement 1 (see FIG. 7A) and the second semiconductor arrangement 2 (see FIG. 7B). The sum of these two layer thicknesses corresponds to the vertical distance between the winding 31, 32. Optionally an additional dielectric layer can be arranged between the first and second semiconductor arrangements 1, 2 when mounting the second semiconductor arrangement 2 onto the first semiconductor arrangement 1. This additional layer may be comprised or may comprise the glue used for joining the two semiconductor arrangement, or may be an additional layer, like as an additional passivation layer, such as an imide, BCB (benzocyclo-buthene), etc. In this case the additional dielectric layer further increases the vertical distance between the first and second windings 31, 32.

Figure 8A:
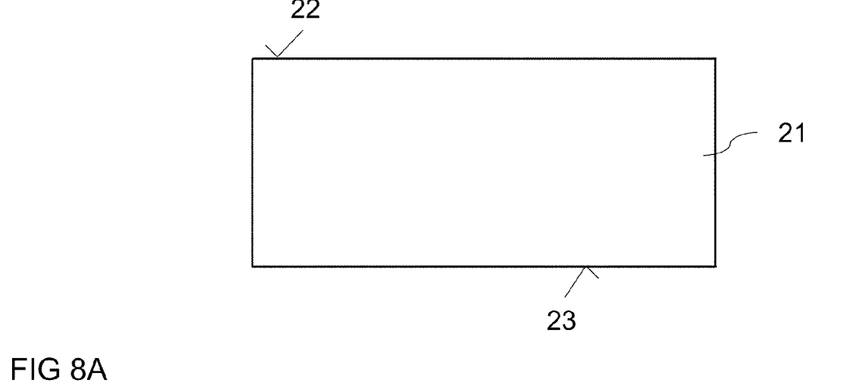
FIGS. 8A-8F illustrate method steps of a first embodiment of a method for producing the second semiconductor arrangement.
Figure 8B:
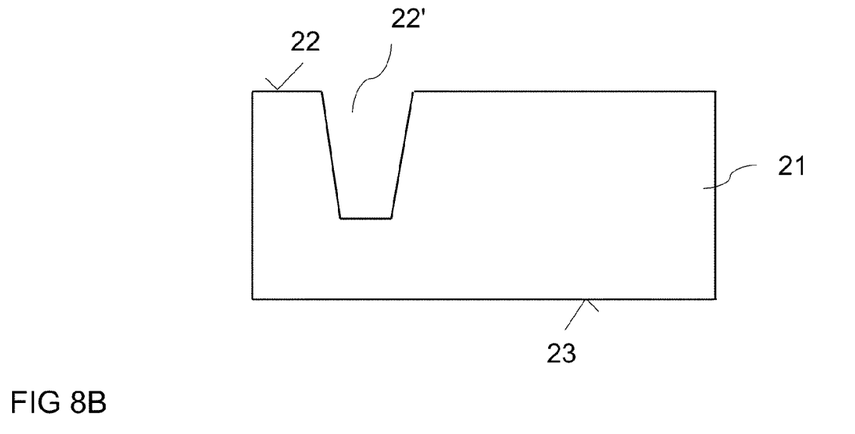

An embodiment of a method for producing a second semiconductor arrangement 2 illustrated in FIG. 7B will now be explained with reference to FIGS. 8A to 8F. Referring to FIG. 8A a first semiconductor body 21 having a first and a second surface 22, 23 is formed. Referring to FIG. 8B a first trench 22' is formed that extends into the semiconductor body 21 starting from the first side 22. Trench 22' may be formed using conventional method steps, such as, e.g., forming a structured etch mask on the first surface 22, and etching the trench 22' using the etch mask (not shown).

Figure 8C:
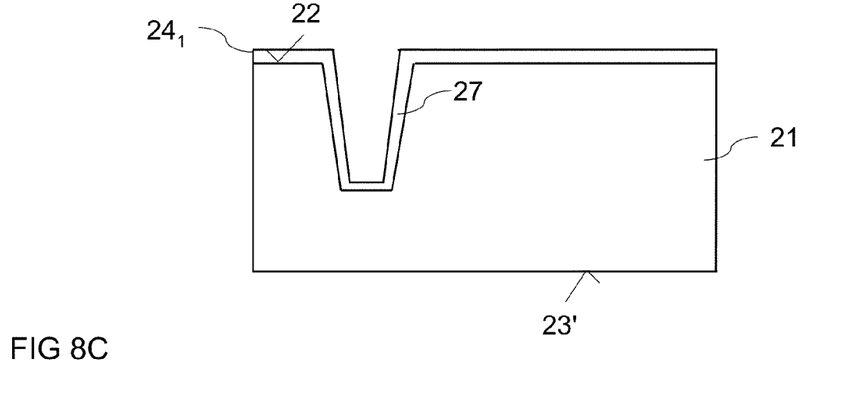

Referring to FIG. 8C a first dielectric partial layer $24_1$ is formed that covers the bottom and the sidewalls of the trench 22' and the first surface 22 of the semiconductor body 21. The first partial layer $24_1$ is, for example, an oxide layer formed by thermally oxidizing the semiconductor body or by depositing an oxide layer. Besides oxide layers, the first and second dielectric layers 14, 24 may be comprised of or may include polymer layers, such as BCB layers, nitride layers, or oxinitride layers, as well.

Figure 8D:
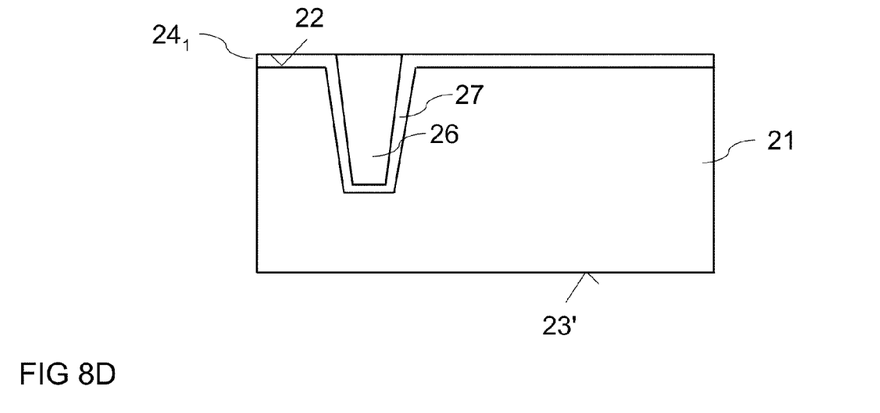

Referring to FIG. 8D the contact plug 26 is formed in the trench. Forming the contact plug 26, e.g., involves: depositing an electrically conducting material, such as a metal or a highly doped crystalline semiconductor material, that completely fills the trench; and removing the electrically conductive material above the first side 22 of the semiconductor body 21. Removing the conductive material, may, e.g., include one of an etching or polishing process, such as a CMP process.

Figure 8E:
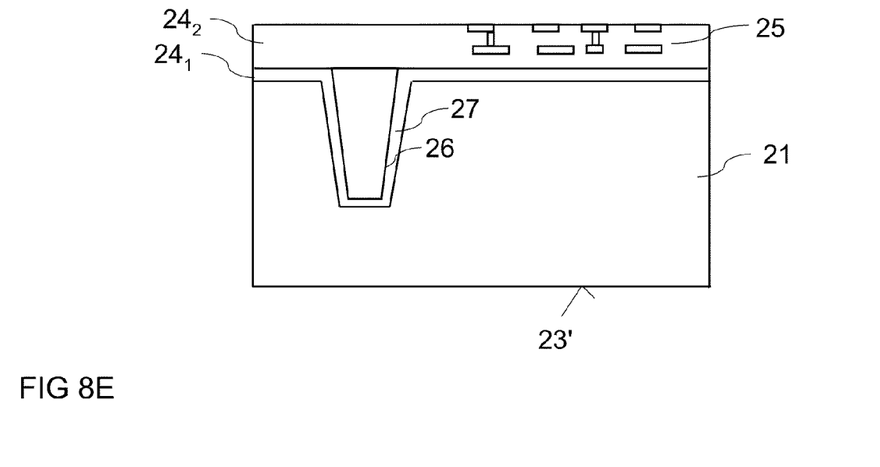

Referring to FIG. 8E, the second wiring arrangement 25 is formed after forming the plug 26. The second wiring arrangement 25 is arranged in a second dielectric partial layer $24_2$, where the second partial layer $24_2$ may be comprised of a number of dielectric layers.

Figure 8F:
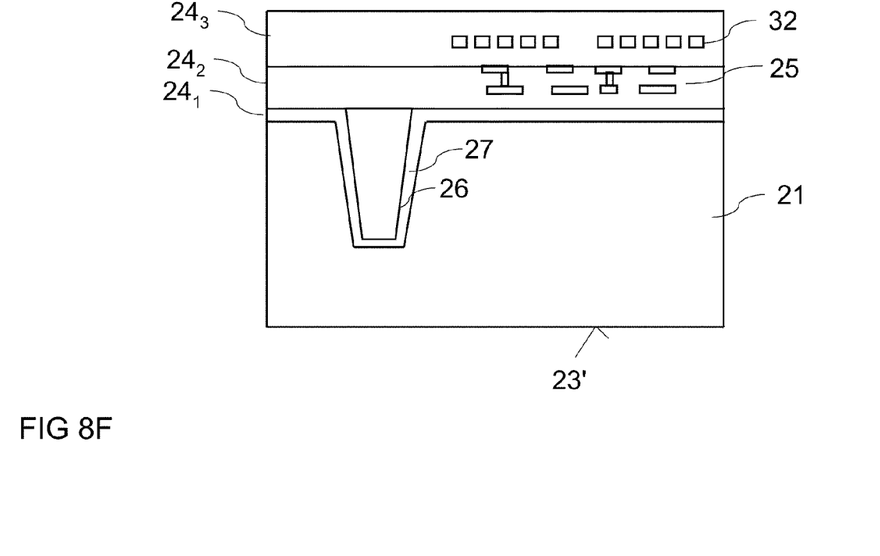

Referring to FIG. 8F, the second winding 32 is formed in a third dielectric partial layer $34_3$, where the third partial layer $24_3$ itself may be comprised of a number of dielectric layers.

According to a further embodiment contact plug 26 is uncovered before mounting the second semiconductor body 21 onto the first semiconductor body 11. This is illustrated in FIGS. 7B and 7C in dashed lines. Uncovering the contact plug may involve at least one of an etching or a polishing process, where this process may be applied to a wafer that includes a plurality of the semiconductor bodies 11, 21, before the wafer is separated into the individual semiconductor bodies. In this case the depth of the trench 22' is chosen such that the second semiconductor body 21, or a wafer including a number of second semiconductor bodies, is sufficiently stable after uncovering the plug. The depth of trench 22', that corresponds to the thickness of the semiconductor body 21 after uncovering the plug 26, is, e.g., between 40 μm and 150 μm.

The signal transmission arrangement embodiments of which have been explained before is suitable to be used in any circuit in which signal transmission between different voltage domains is required. Examples of such circuits are: flyback converters that have a primary and a secondary side and in which signal transmission from the secondary to primary side is required; or level shifters.

Figure 9:
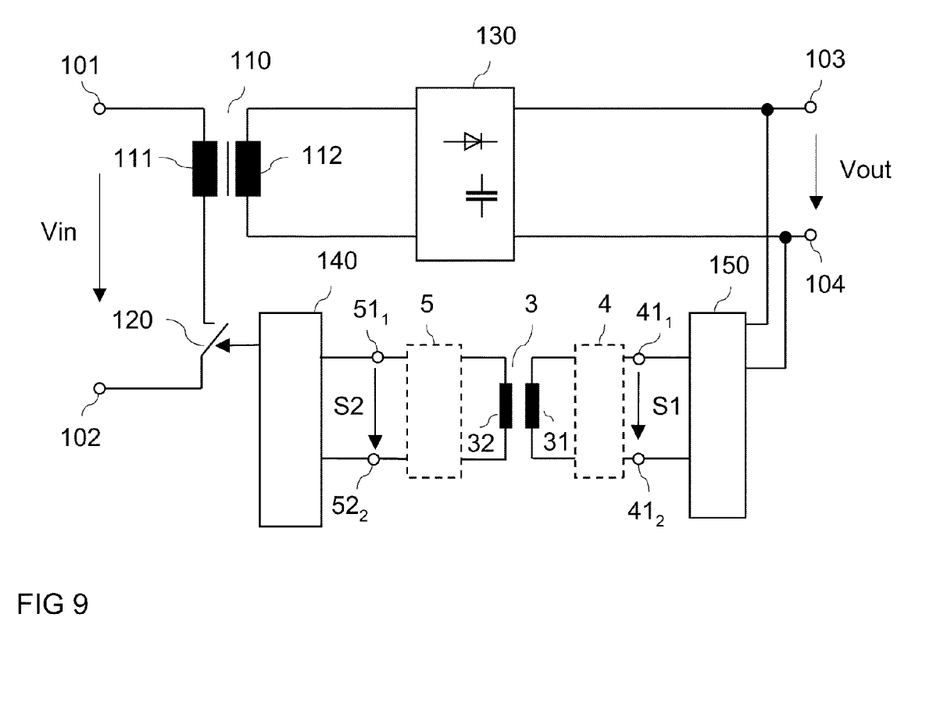
FIG. 9 illustrates a flyback converter having a signal transmission arrangement.

An embodiment of a flyback converter including a signal transmission arrangement as explained hereinabove is illustrated in FIG. 9. The converter has input terminals 101, 102 for applying an input voltage Vin thereto, and output terminals 103, 104 for providing an output voltage Vout to a load (not shown). The converter further has a transformer 110 with a primary winding 111, and a secondary winding 112. The primary winding 111 is connected in series with a switching element 120, such as an MOSFET or an IGBT, with the series circuit connected between the input terminals. The switching element 120 is driven by a controller 140 that provides a pulse-width modulated drive signal to the switching element 120 in order to switch the switching element 120 on and off in a pulse-width modulated manner.

The secondary winding 112 of the transformer is coupled to the output terminals 103, 104 via a rectifier circuit 130 that, e.g., includes at least one rectifier element and a capacitor. Such rectifier circuits are commonly known, so that no further explanations are required in this regard. During operation the switching element 120, driven by the controller 140, generates a pulse-width modulated voltage from the input voltage Vin across the primary winding 111, with the primary winding storing energy during on-periods of the switching element 120, and transferring the stored energy to the secondary winding 112 during off-periods. The rectifier circuit 130 generates a rectified (DC) output voltage Vout from the oscillating voltage across the secondary winding 112.

The output voltage Vout is dependent on the input voltage Vin, and on the duty-cycle of the control signal of the switching element 120. In order to regulate the output voltage Vout to a given set-value control circuit 140 is adapted to control the duty-cycle dependent on the output voltage Vout. The input and the output voltage Vin, Vout can be related to different reference potentials. For transferring an output voltage information across the voltage barrier, that results from the different reference potentials, the converter includes a signal transmission arrangement explained hereinbefore. In FIG. 9 the signal transmission arrangement is represented by means of the equivalent circuit diagram of FIG. 2. The signal transmission arrangement may be implemented in accordance with any of the embodiments explained hereinabove.

In the converter according to FIG. 9 the signal transmission arrangement receives an output voltage signal 51 at its input terminals $41_1$, $41_2$. The output voltage signal 51 is provided by a voltage measuring arrangement 150 that is coupled to the output terminals 103, 104, and is dependent on the output voltage Vout. Voltage measurement circuit 150 may include a regulator having a proportional (P), an integrating (I) or a proportional-integrating (PI) behavior.

Transmitter circuit 4 receives the output voltage signal S1 and generates a signal suitable to be transmitted via the transformer 3 from the output voltage signal S1. Receiver circuit 5 receives the signal transmitted via the transformer 3 and generates an output voltage signal S2 that is suitable to be handled by the controller 140 from the transmitted signal. Ideally, received signal S2 is identical to the transmitted signal S1, except for transmission delays and/or a scaling.

It should be mentioned that the transmitter circuit 4 (shown in dashed lines) could be integrated in the measuring arrangement 150, where in this case the measuring arrangement provides a signal suitable to be transmitted via the transformer 3, and that that the receiver circuit 5 (shown in dashed lines) could be integrated in the controller 140, where in this case the controller generates the output voltage signal from the signal received via the transformer 3.

According to the embodiment explained with reference to FIG. 1, the receiver circuit 5 is integrated in the second semiconductor body (see, e.g., 21 in FIG. 1), and the transmitter circuit 4 is integrated in the first semiconductor body (see, e.g., 11 in FIG. 1). According to an embodiment of the converter according to FIG. 9, the controller 140 is integrated in the same semiconductor body as the receiver circuit 5, and the measuring arrangement 150 is integrated in the same semiconductor body as the transmitter circuit 4. Optionally the switching element 120 is integrated in the same semiconductor body as the controller 140.

Finally it should be mentioned that features that have been explained in connection with one embodiment may be combined with features of other embodiments, even if this has not explicitly been mentioned.

What is claimed is:

1. A signal transmission arrangement, comprising:
a first semiconductor arrangement comprising a first semiconductor substrate having a first side and a second side, a first dielectric layer arranged on the first side of the first semiconductor substrate, and a first winding of a transformer arranged in the first dielectric layer; and
a second semiconductor arrangement comprising a second semiconductor substrate having a first side and a second side, a second dielectric layer arranged on the first side of the second semiconductor substrate, and a second winding of a transformer arranged in the second dielectric layer;
wherein the first and second semiconductor arrangements are arranged such that the first and second dielectric layers adjoin one another; and
wherein the first semiconductor substrate has at least one contact terminal at the second side, and has a contact via extending through the first semiconductor substrate.

2. The signal transmission arrangement of claim 1,
wherein the second semiconductor arrangement is arranged on the first semiconductor arrangement,
wherein dimensions of the first semiconductor arrangement are smaller than dimensions of the second semiconductor arrangement, and
wherein the second semiconductor arrangement comprises at least one contact electrode in or on the first dielectric layer in a region not covered by the first semiconductor arrangement.

3. The signal transmission arrangement of claim 2, wherein at least one contact of the first semiconductor arrangement is arranged such that at least parts of the second winding are arranged between the at least one contact of the first semiconductor arrangement and at least one contact of the second semiconductor arrangement.

4. The signal transmission arrangement of claim 1, wherein the second semiconductor substrate has at least one contact terminal at a second side, and a contact via extending through the second semiconductor substrate.

5. The signal transmission arrangement of claim 4,
wherein the second semiconductor arrangement is arranged on the first semiconductor arrangement, and
wherein the first semiconductor arrangement is arranged on a carrier.

6. The signal transmission arrangement of claim 5,
wherein dimensions of the first semiconductor arrangement are smaller than dimensions of the carrier, and
wherein the carrier comprises at least one contact electrode in a region not covered by the first semiconductor arrangement, the at least one contact electrode being electrically connected with at least one contact electrode of the first semiconductor arrangement.

7. The signal transmission arrangement of claim 1, wherein the first semiconductor arrangement further comprises:
a first wiring arrangement arranged in the first dielectric layer, the first wiring arrangement being electrically coupled to the first winding and to at least one contact electrode of the first semiconductor arrangement.

8. The signal transmission arrangement of claim 7, wherein the first semiconductor arrangement further comprises:
a first integrated circuit in the first semiconductor substrate, the integrated circuit being electrically coupled to the first wiring arrangement.

9. The signal transmission arrangement of claim 1, wherein the second semiconductor arrangement further comprises:
a second wiring arrangement arranged in the second dielectric layer, the second wiring arrangement being electrically coupled to the second winding and to at least one contact electrode of the second semiconductor arrangement.

10. The signal transmission arrangement of claim 9, wherein the second semiconductor arrangement further comprises:
a second integrated circuit in the second semiconductor substrate, the integrated circuit being electrically coupled to the second wiring arrangement.

11. The signal transmission arrangement of claim 1,
wherein the first semiconductor arrangement comprises at least two contact electrodes,
and
wherein the second semiconductor arrangement comprises at least two contact electrodes.

12. The signal transmission arrangement of claim 1, wherein one of the first and second windings has smaller dimensions in a horizontal plane than the other winding, the smaller winding being completely overlapped by the larger winding.

13. A voltage converter comprising:
input terminals for applying an input voltage;
output terminals for providing an output voltage;
a transformer having a primary winding coupled to the input terminals, and having a secondary winding coupled to the output terminals via a rectifier arrangement;
a controller for generating a drive signal;
a switching element, driven by the drive signal of the controller, for generating a pulse-width modulated voltage from the input voltage across the primary winding;
a voltage measuring arrangement coupled to the output terminals, and adapted to generate an output voltage signal dependent on the output voltage; and a signal transmission arrangement, comprising:
a first semiconductor arrangement comprising a first semiconductor substrate having a first side and a second side, a first dielectric layer arranged on the first side of the first semiconductor substrate, and a first winding of a transformer arranged in the first dielectric layer, the first semiconductor substrate having at least one contact terminal at the second side and a contact via extending through the first semiconductor substrate;
a second semiconductor arrangement comprising a second semiconductor substrate having a first side and a second side, a second dielectric layer arranged on the first side of the second semiconductor substrate, and a second winding of a transformer arranged in the second dielectric layer, the first and second semiconductor arrangements being arranged such that the first and second dielectric layers adjoin one another;
one of the first winding or second winding being coupled to the voltage measuring arrangement, and the other one of the first winding or second winding being coupled to the controller.

14. The voltage converter of claim 13, wherein the one of the first winding or second winding is coupled to the voltage measuring arrangement via a transmitter circuit, and wherein the other one of the first winding and second winding is coupled to a controller arrangement via a receiver circuit.

15. The signal transmission arrangement of claim 1, wherein a total surface area of the first winding in a horizontal plane parallel to a major surface of the first semiconductor substrate is different than a total surface area of the second winding in the horizontal plane.

16. The voltage converter of claim 13, wherein a total surface area of the first winding in a horizontal plane parallel to a major surface of the first semiconductor substrate is different than a total surface area of the second winding in the horizontal plane.

17. A signal transmission arrangement, comprising:
a first semiconductor arrangement comprising a first semiconductor substrate having a first side and a second side, a first dielectric layer arranged on the first side of the first semiconductor substrate, and a first winding of a transformer arranged in the first dielectric layer; and
a second semiconductor arrangement comprising a second semiconductor substrate having a first side and a second side, a second dielectric layer arranged on the first side of the second semiconductor substrate, and a second winding of a transformer arranged in the second dielectric layer;
wherein in a horizontal plane parallel to a major surface of the first semiconductor substrate, the first winding has a smaller area than the second winding;
wherein the first and second semiconductor arrangements are arranged such that the first and second dielectric layers adjoin one another.

18. The signal transmission arrangement of claim 17, wherein the first semiconductor substrate has at least one contact terminal at the second side, and has a contact via extending through the first semiconductor substrate.

19. The signal transmission arrangement of claim 18, wherein the first semiconductor arrangement is arranged on the second semiconductor arrangement, wherein dimensions of the first semiconductor arrangement are smaller than dimensions of the second semiconductor arrangement, and wherein the second semiconductor arrangement comprises at least one contact electrode in or on the first dielectric layer in a region not covered by the first semiconductor arrangement.

20. The signal transmission arrangement of claim 19, wherein at least one contact of the first semiconductor arrangement is arranged such that at least parts of the second winding are arranged between the at least one contact of the first semiconductor arrangement and at least one contact of the second semiconductor arrangement.

21. The signal transmission arrangement of claim 18, wherein
the second semiconductor substrate has at least one contact terminal at a second side, and a contact via extending through the second semiconductor substrate.

22. The signal transmission arrangement of claim 21, wherein the second semiconductor arrangement is arranged on the first semiconductor arrangement, and wherein the first semiconductor arrangement is arranged on a carrier.

23. The signal transmission arrangement of claim 22, wherein dimensions of the first semiconductor arrangement are smaller than dimensions of the carrier, and wherein the carrier comprises at least one contact electrode in a region not covered by the first semiconductor arrangement, the at least one contact electrode being electrically connected with at least one contact electrode of the first semiconductor arrangement.

24. The signal transmission arrangement of claim 18, wherein the first semiconductor arrangement further comprises:
a first wiring arrangement arranged in the first dielectric layer, the first wiring arrangement being electrically coupled to the first winding and to at least one contact electrode of the first semiconductor arrangement.

25. The signal transmission arrangement of claim 24, wherein the first semiconductor arrangement further comprises:
a first integrated circuit in the first semiconductor substrate, the integrated circuit being electrically coupled to the first wiring arrangement.

26. The signal transmission arrangement of claim 18, wherein the second semiconductor arrangement further comprises:
a second wiring arrangement arranged in the second dielectric layer, the second wiring arrangement being electrically coupled to the second winding and to at least one contact electrode of the second semiconductor arrangement.

27. The signal transmission arrangement of claim 26, wherein the second semiconductor arrangement further comprises:
a second integrated circuit in the second semiconductor substrate, the integrated circuit being electrically coupled to the second wiring arrangement.

28. The signal transmission arrangement of claim 18, wherein the first semiconductor arrangement comprises at least two contact electrodes, and
wherein the second semiconductor arrangement comprises at least two contact electrodes.

29. The signal transmission arrangement of claim 18, wherein one of the first and second windings has smaller dimensions in a horizontal plane than the other winding, the smaller winding being completely overlapped by the larger winding.

30. The signal transmission arrangement of claim 1, wherein the first and second semiconductor arrangements are flip-chip bonded to each other.

31. The voltage converter of claim 13, wherein the first and second semiconductor arrangements are flip-chip bonded to each other.

32. The voltage converter of claim 13, further comprising another contact via extending through the second semiconductor substrate.

33. The voltage converter of claim 13, wherein the first winding has a smaller area than the second winding in a horizontal plane parallel to a major surface of the first semiconductor substrate.

34. The signal transmission arrangement of claim 17, wherein the first and second semiconductor arrangements are flip-chip bonded to each other.

* * * * *